United States Patent
Kawaguchi et al.

[11] Patent Number: 5,834,368
[45] Date of Patent: Nov. 10, 1998

[54] INTEGRATED CIRCUIT WITH A METAL SILICIDE FILM UNIFORMLY FORMED

[75] Inventors: Hiroshi Kawaguchi; Isami Sakai, both of Tokyo, Japan

[73] Assignee: NEC Corporation, Tokyo, Japan

[21] Appl. No.: 814,601

[22] Filed: Mar. 10, 1997

Related U.S. Application Data

[63] Continuation of Ser. No. 511,910, Aug. 7, 1995, abandoned, which is a continuation of Ser. No. 16,853, Feb. 12, 1993, abandoned.

[30] Foreign Application Priority Data

| | | | |
|---|---|---|---|
| Feb. 13, 1992 | [JP] | Japan | 4-026985 |
| Apr. 6, 1992 | [JP] | Japan | 4-083970 |
| Aug. 13, 1992 | [JP] | Japan | 4-216228 |

[51] Int. Cl.$^6$ ............................................. H01K 21/44
[52] U.S. Cl. .................. 438/621; 438/535; 438/581; 438/664; 438/683; 148/DIG. 144
[58] Field of Search ...................... 438/533, 581, 438/582, 664, 682, 685, 660, 621, 683; 148/DIG. 147

[56] References Cited

U.S. PATENT DOCUMENTS

| | | |
|---|---|---|
| 4,378,628 | 4/1983 | Levinstein et al. . |
| 4,551,908 | 11/1985 | Nagasawa et al. . |
| 4,920,073 | 4/1990 | Wei et al. . |
| 5,010,032 | 4/1991 | Tang et al. .................. 437/57 |
| 5,081,065 | 1/1992 | Jonkers et al. . |
| 5,102,826 | 4/1992 | Ohshima et al. . |
| 5,236,868 | 8/1993 | Nulman .................. 437/200 |

FOREIGN PATENT DOCUMENTS

| | | |
|---|---|---|
| 62-33466 | 2/1987 | Japan . |
| 63-117420 | 5/1988 | Japan . |

OTHER PUBLICATIONS

W. Rausch, et al. "Palladium silicide contact resistance stabilization by ion implantation" IBM Tech. Discl. Bull. (Dec. 1981) vol. 24 No. 7A p. 3453.

Primary Examiner—Carndad Everhart

[57] ABSTRACT

A method for manufacturing an integrated circuit, wherein, before providing an IC composite by forming a metal film on an IC assembly which includes a semiconductor substrate and a silicon part formed along the substrate and consisting essentially of silicon, an amorphous region is formed into the silicon part. The IC composite is subjected to first primary and secondary heat treatments in a nitrogen atmosphere and then to a second heat treatment at 600°–700° C., 700°–900° C., and 700°–900° C. to turn the metal film on the silicon part into a metal silicide film of excellent uniformity. The assembly has a silicon dioxide portion, on which the metal film is turned during the first primary and secondary heat treatments into a metal nitride film. The second heat treatment is carried out after the removal of the metal nitride film.

12 Claims, 4 Drawing Sheets

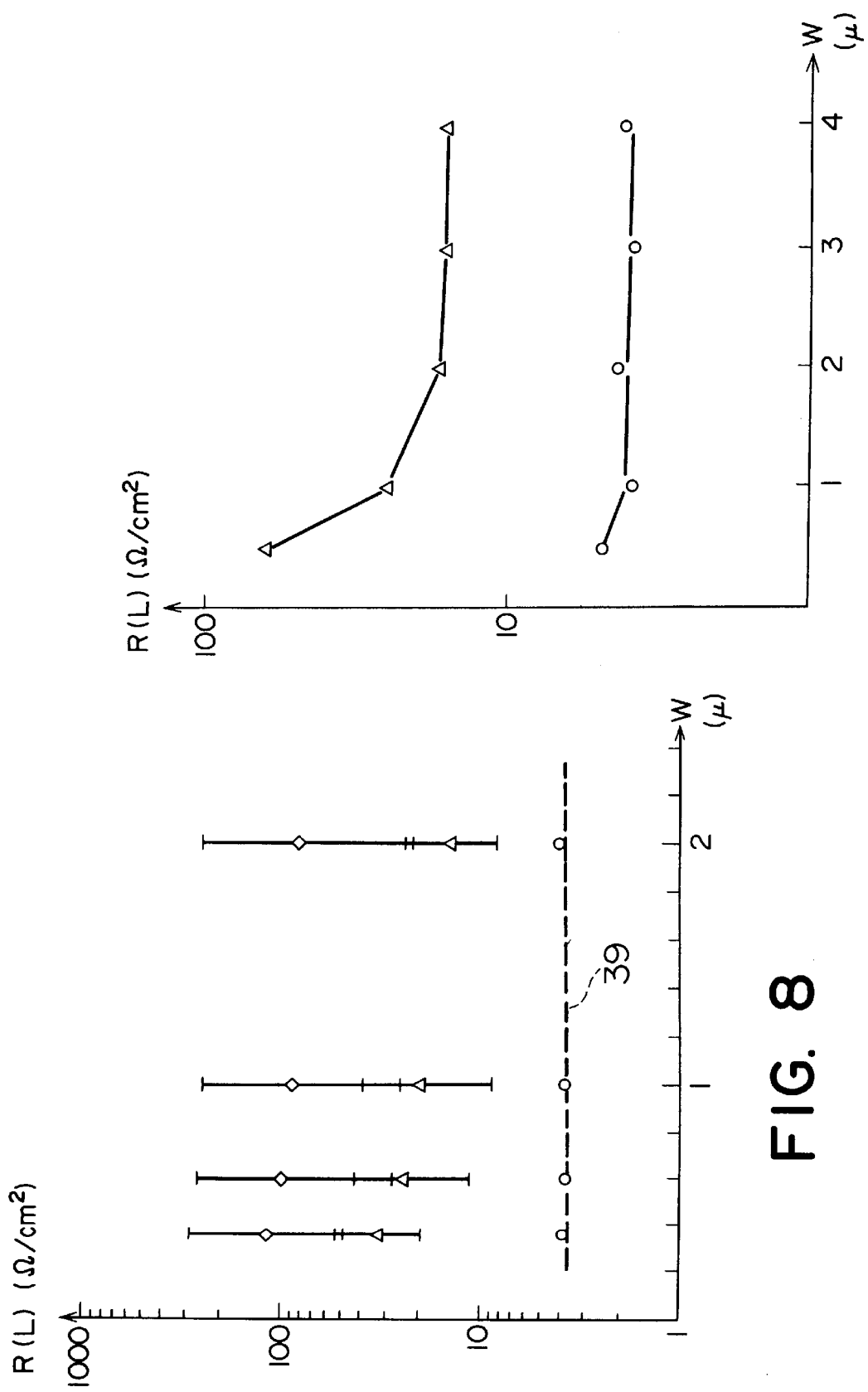

INTEGRATED CIRCUIT WITH A METAL SILICIDE FILM UNIFORMLY FORMED

This is a continuation of application Ser. No. 08/511,910, filed Aug. 7, 1995, now abandoned, which is a continuation of Ser. No. 08/016,853, filed Feb. 12, 1993, now abandoned.

BACKGROUND OF THE INVENTION

This invention relates to an integrated circuit comprising a metal silicide film and, more particularly, to a method of manufacturing the same. The metal silicide film is typically a titanium, a tungsten, a molybdenum, or a cobalt silicide film.

In the manner which will later be described in greater detail, it is known to provide wirings of an integrated circuit by a metal silicide film formed on an integrated circuit assembly having an exposed assembly surface and comprising a semiconductor substrate and a silicon part which essentially consists of silicon and is formed along the semiconductor substrate to have an exposed part surface as a portion of the exposed assembly surface. On manufacturing the integrated circuit with a titanium silicide film, a titanium film is formed on the exposed assembly surface to provide an integrated circuit composite.

By subjecting the integrated circuit composite to a first heat treatment at a preselected temperature, the titanium film is made to merge into the silicon part to provide a higher resistivity titanium silicide film. By subjecting the integrated circuit assembly with the higher resistivity titanium silicide film to a second heat treatment at a higher temperature, the higher resistivity titanium silicide film is turned into a lower resistivity titanium silicide film.

It has been found by the present joint inventors in connection with such a conventional integrated circuit that the titanium film is not satisfactorily turned at the silicon part into the higher resistivity titanium silicide film particularly when the silicon part includes an n-type impurity to a high impurity concentration. This adverse tendency becomes serious when each wiring has a narrow wiring width.

It has also been found that the higher resistivity titanium silicide film has a nonuniform thickness below the exposed part surface. The second heat treatment exaggerates this nonuniformity. As a consequence, the titanium silicide film is given an objectionably high electric resistance value.

It has furthermore been found that a rate or speed of formation of the higher resistivity titanium silicide film is slower in an n-type doped silicon part than in a p-type doped silicon part. This gives rise to various problems on manufacturing an integrated circuit which comprises n-channel and p-channel transistors like a complementary metal-oxide-semiconductor (CMOS) or metal-insulator-semiconductor (CMIS) integrated circuit.

SUMMARY OF THE INVENTION

It is consequently a principal object of the present invention to provide an integrated circuit comprising a uniformly formed metal silicide film.

It is another principal object of this invention to provide a method of manufacturing an integrated circuit comprising a uniformly formed metal silicide film.

It is a subordinate object of this invention to provide a method which is of the type described and by which the metal silicide film is formed even along an n-type silicon part doped to a high impurity concentration.

It is another subordinate object of this invention to provide a method which is of the type described and by which metal silicide films are uniformly formed on a silicon part doped with an n-type impurity and on another silicon part doped with a p-type impurity.

Other objects of this invention will become clear as the description proceeds.

On setting forth the gist of an aspect of this invention, it is possible to understand that an integrated circuit includes a semiconductor substrate and a part formed along the semiconductor substrate, which consists essentially of silicon and has an exposed part surface.

In accordance with this aspect of the invention, the integrated circuit comprises a metal silicide film formed into the part and has a uniform depth from the exposed part surface.

On setting forth the gist of a further aspect of this invention, it is possible to understand that a method of manufacturing an integrated circuit comprises the steps of manufacturing an integrated circuit assembly having an exposed assembly surface and having a semiconductor substrate and a silicon part formed along the semiconductor substrate, which consist essentially of silicon and has an exposed part surface as a portion of the assembly surface, forming a metal film on the exposed assembly surface to provide an integrated circuit composite, and heat treating the integrated circuit composite to turn the metal film into a metal silicide film on the exposed part surface.

In accordance with another aspect of this invention, the method comprises the step of preliminarily turning the silicon part into an amorphous part adjacent to the exposed part surface before the metal film forming step.

In accordance with a further aspect of this invention, the heat treating step of the method is carried out firstly at a primary temperature between 600° C. and 700° C. and subsequently at a secondary temperature between 700° C. and 900° C.

BRIEF DESCRIPTION OF THE DRAWINGS

FIG. 8 is another diagram illustrative of characteristics of integrated circuits manufactured in accordance with a conventional method and a method according to a second embodiment of this invention; and FIG. 9 is a still another diagram illustrative of characteristics of integrated circuits manufactured in accordance with a conventional method and a method according to a third embodiment of this invention.

DESCRIPTION OF THE PREFERRED EMBODIMENTS

Figure 1:
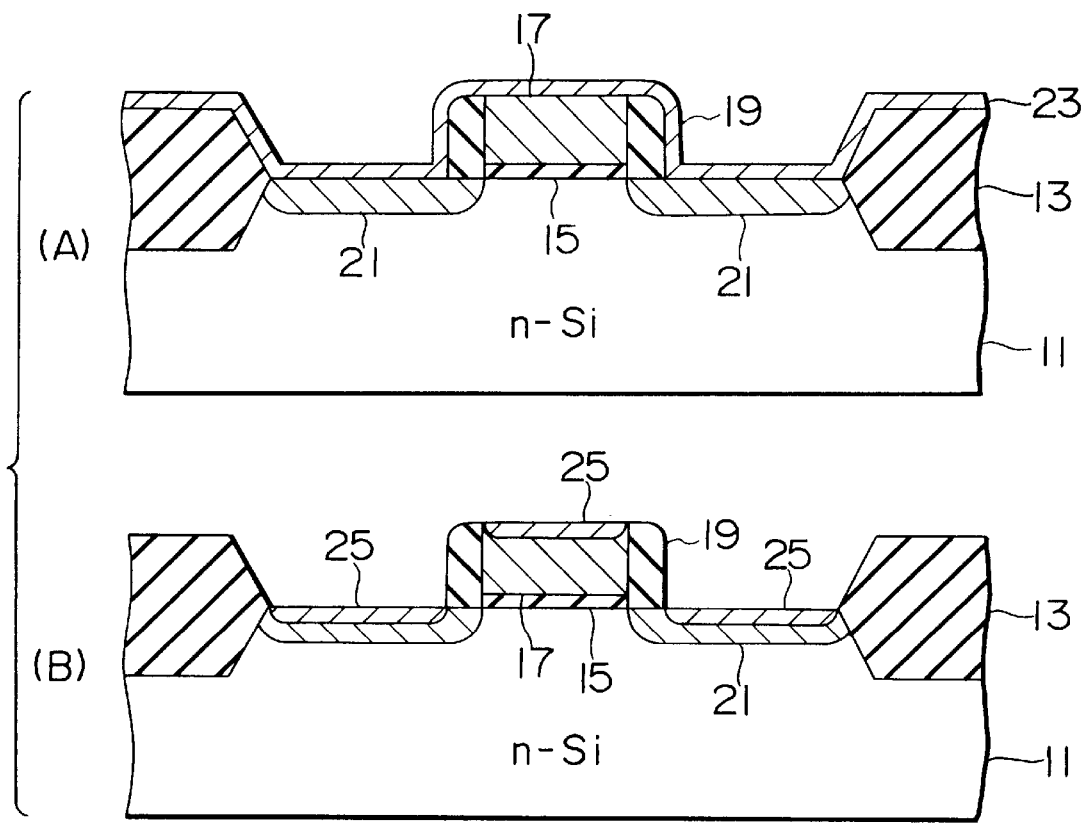
FIGS. 1(A) and (B) are schematic vertical sectional views of an integrated circuit during various steps of manufacture according to a conventional method.

Referring to FIGS. 1(A) and (B), a conventional method of manufacturing an integrated circuit will first be described in order to facilitate an understanding of the present invention. It should be noted in connection with the conventional method that the integrated circuit is appreciably different from that manufactured by methods according to this invention.

In the manner which will presently be described, the integrated circuit comprises an integrated circuit assembly and a metal silicide film provided along the assembly. The metal silicide film is typically a titanium, a tungsten, a molybdenum, or a cobalt silicide film.

In FIG. 1(A), a semiconductor substrate 11 is an n-type silicon substrate n-Si and has a principal upper surface. An element isolation or field oxide layer 13 was selectively formed of silicon dioxide along the principal surface. On a predetermined area of a portion surrounded on the principal surface by the isolation layer 13, a gate insulation film 15 was selectively formed of silicon dioxide. On the gate isolation film 15, a gate electrode 17 was formed of polysilicon. The gate insulation film 15 and the gate electrode 17 were patterned and surrounded by a side wall 19 of silicon dioxide.

By selective ion injection of boron ions into the substrate 11, a p-type diffusion region 21 was formed as shown, in the semiconductor substrate 11 typically to a diffusion region depth between 1200 and 2400 angstroms. Each of the gate electrode 17 and the diffusion region 21 is a silicon part which is formed along the principal surface to consist essentially of silicon and has an exposed part surface. In this manner, the integrated circuit assembly (11–21) has been manufactured to comprise mainly the semiconductor substrate 11, the element isolation layer 13, and the silicon part 21 or 17 and has an exposed assembly surface including the exposed part surface.

A titanium film 23 was sputtered onto the exposed assembly surface as a metal film to provide an integrated circuit composite comprising the integrated circuit assembly and the metal film 23. The titanium film 23 has a metal film thickness selected, for example, between 300 and 1000 angstroms.

The integrated circuit composite (11–23) shown in FIG. 1(B) was subjected to a first heat treatment or sintering in a nitrogen atmosphere which essentially consist of nitrogen and may be either a nitrogen atmosphere or an ammonia atmosphere. The first heat treatment was carried out at a first temperature selected between 600° C. and 700° C. during a first time interval selected between 30 and 60 seconds. The first temperature and the first time interval were optimally selected in consideration of the metal film thickness. Through the first heat treatment, the titanium film 23 (FIG. 1(A)) was turned into higher resistivity titanium silicide films 25 partly along or into the silicon parts 21 and 17 from the exposed part surface.

Comparing FIGS. 1(A) and (B), it is appreciated that the titanium silicide films 25 were formed to merge into the silicon parts 21 and 17 and to leave at each diffusion region 21 a remaining portion of the silicon part 21 below the titanium silicide film 25. Each titanium silicide film 25 has a higher specific resistance value of 100 through 110 microohm-centimeter.

Figure 2:
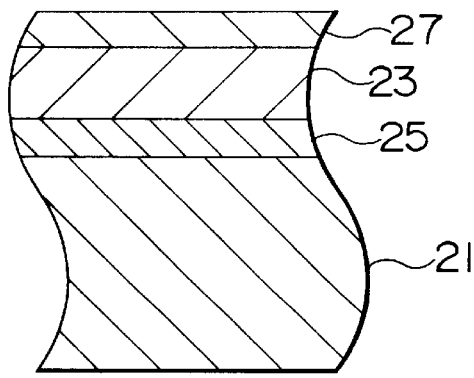
FIG. 2 is a partial schematic vertical sectional view of an integrated circuit during one of various step of manufacture in general.

Turning to FIG. 2 during a short while, a reaction takes place during the first heat treatment between the silicon part 21 or 17 and the titanium film 23 to grow the higher resistivity titanium silicide film 25 from an interface between the silicon part 21 or 17 and the titanium film 23. In the meantime, a titanium nitride film 27 grows from an exposed surface of the titanium film 23 as a result of the reaction between the titanium film 23 and the nitrogen atmosphere. It should be noted that the titanium nitride film 27 is electrically conductive.

The metal film thickness of an intervening titanium film 23 consequently decreases during the progress of the first heat treatment until a time instant at which the higher resistivity titanium silicide film 25 is eventually brought into contact with the titanium nitride film 27. The reaction comes to an end even if the first heat treatment were continued longer.

Figure 3:
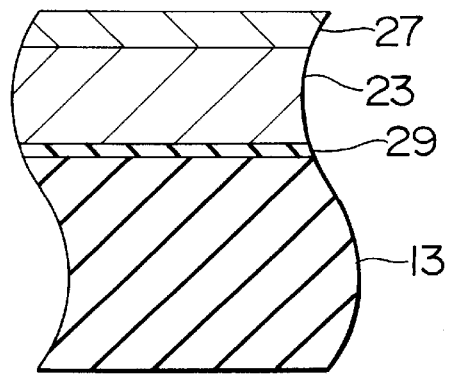
FIG. 3 is another partial schematic vertical sectional view of the integrated circuit illustrated partly in FIG. 2.

Further turning to FIG. 3, the titanium film 23 was sputtered also onto each silicon dioxide portion 13 or 19, which includes oxide besides silicon and has an exposed portion surface as a part of the exposed assembly surface. A thin titanium oxide film 29 consequently grows during the first heat treatment from an interface between the silicon dioxide portion 13 or 19 and the titanium film 23. The titanium oxide film 29 is insulative.

Meanwhile, the titanium nitride film 27 grows in the manner described in conjunction with FIG. 2. Inasmuch as the titanium oxide film 29 is very thin, the titanium film 23 partly remains over the exposed portion surface when the first heat treatment ends in the first time interval. This partly remaining titanium film 23 is insulated by the titanium oxide film 29 from the silicon dioxide portion 13 or 19.

Turning back to FIG. 1(B), the integrated circuit assembly with the higher resistivity titanium silicide films 25 was dipped in a mixture of water, hydrogen peroxide, and ammonia, namely, an aqueous solution of hydrogen peroxide and ammonia, to remove only the titanium nitride film 27 described in connection with FIGS. 2 and 3 and to electrically isolate the gate electrode 17 from the diffusion regions 21. After the removal of the titanium nitride film 27, the integrated circuit assembly with the higher resistivity titanium silicide films 25 was subjected to a second heat treatment or sintering at a second temperature of about 800° C. during a second time interval of about 30 seconds.

The higher resistivity titanium silicide films 25 were turned into lower resistivity titanium silicide films. Being different only with regard to resistivity, the lower resistivity titanium silicide film or films 25 will be designated again by the reference numeral 25.

Each lower resistivity titanium silicide film 25 had a specific resistance value of, for example, about 15 microohm-centimeter. The lower resistivity titanium silicide film 25 is the afore-mentioned metal silicide film. With a predetermined wiring width given, the lower resistivity titanium silicide films 25 are used as wirings of the integrated circuit.

Reviewing FIGS. 1(A) and (B), 2, and 3, it may be possible to form the lower resistivity titanium silicide films 25 by subjecting the integrated circuit composite to a single-stage heat treatment at the second temperature. This is, however, objectionable because silicon diffuses at the second temperature through the titanium film 23 from its portion overlying the silicon part 21 or 17 to another portion overlying the silicon dioxide portion 13 or 19 to form the lower resistivity titanium silicide film 25 along the silicon dioxide portion 13 or 19 to undesiredly electrically connect the diffusion region 21 to the gate electrode 17 and to a like diffusion region which is formed on another portion surrounded on the principal surface by the isolation layer 13. As a result, the first temperature must not be higher than 700° C.

Reviewing FIGS. 1(A) and (B), the semiconductor substrate 11 may be of a p-type silicon substrate. The diffusion region 21 may be doped with an n-type impurity.

It has been found by the present joint inventors in connection with such a conventional integrated circuit that the silicon part 21 or 17 is not satisfactorily turned into the higher resistivity titanium silicide film 25 by the first heat treatment, particularly when the silicon part 21 or 17 includes the n-type impurity to a high impurity concentration. This adverse tendency becomes serious when the diffusion region 21 includes arsenic to an impurity concentration of higher than $2 \times 10^{20}/cm^3$. Even when the arsenic concentration is lower, the higher resistivity titanium silicide film 25 grows slower on the n-type diffusion region than on the p-type diffusion region. Slow formation of the higher resistivity titanium silicide film 25 on the silicon part 21 or 17 becomes more serious when the wiring width is narrow.

Incidentally, it is theoretically possible to form the diffusion region 21 after formation of the higher resistivity titanium silicide film 25. This is, however, undesirable in practice because the titanium film 23 is subjected to knock on during formation of the diffusion region 21 to raise a titanium concentration in the diffusion region 21 and to accordingly objectionably increase a leakage current.

Figure 4:
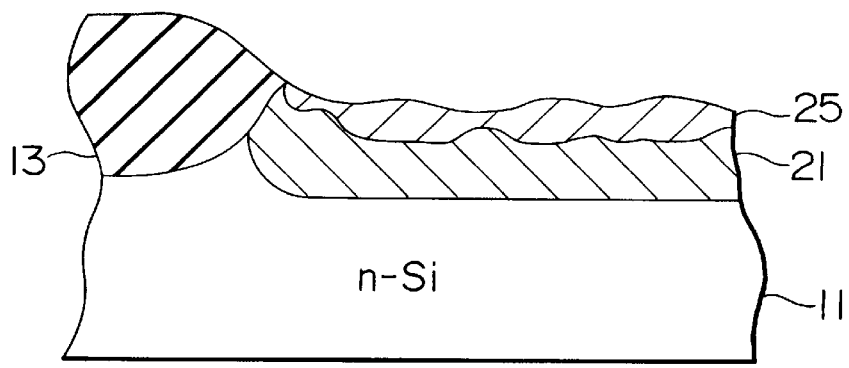
FIG. 4 is a partial schematic vertical sectional view of the integrated circuit depicted in FIG. 1(B)

Referring temporarily to FIG. 4, it has also been found that the higher resistivity titanium silicide film 25 has a nonuniform thickness or depth below the exposed part surface as exaggeratedly depicted. This nonuniformity amounts to several hundreds of angstroms. The second heat treatment undesiredly intensifies the nonuniformity. As a consequence, the lower resistivity titanium silicide film 25 may have a zero film thickness in the worst case to break the wiring at the part particularly when the wiring width is narrow.

Referring again to FIGS. 1(A) and (B), it has been found that the afore-mentioned difference in rates of formation of the higher resistivity titanium silicide film 25 on the n-type and the p-type diffusion regions, such as 21, gives rise to various problems. This is unavoidable with a conventional method of manufacturing an integrated circuit which comprises p-channel and n-channel transistors like a CMOS or a CMIS integrated circuit.

More specifically, the metal silicide film 25 is thinner on the n-type diffusion region than on the p-type diffusion region. It should be noted in this connection that the metal silicide film 25 has a common specific resistance value on the n-type and the p-type diffusion regions after the second heat treatment. As a result, the metal silicide film 25 has inevitably different layer or film resistance values on the n-type and the p-type diffusion regions provided that such metal silicide films 25 are formed with no attention directed to the difference between the film thicknesses. This may not seriously adversely affect characteristics of the integrated circuit under consideration.

It should, however, be noted that the diffusion region 21 remains as a remaining region below the metal silicide film 25 after the second heat treatment. Inasmuch as the metal silicide film 25 is thicker under the circumstances along the p-type diffusion region than along the n-type diffusion region, the p-type diffusion region must be deeper below the principal surface of the semiconductor substrate 11 than along the n-type diffusion region in order to give a common thickness to the remaining regions in the n-type and the p-type diffusion regions.

This deep diffused p-type diffusion region has a greater short-channel effect than the n-type diffusion region when the both diffusion regions have a common channel length. Design of the p-channel transistor therefore becomes difficult particularly when a shorter channel length should be given to the diffusion regions.

Figure 5:
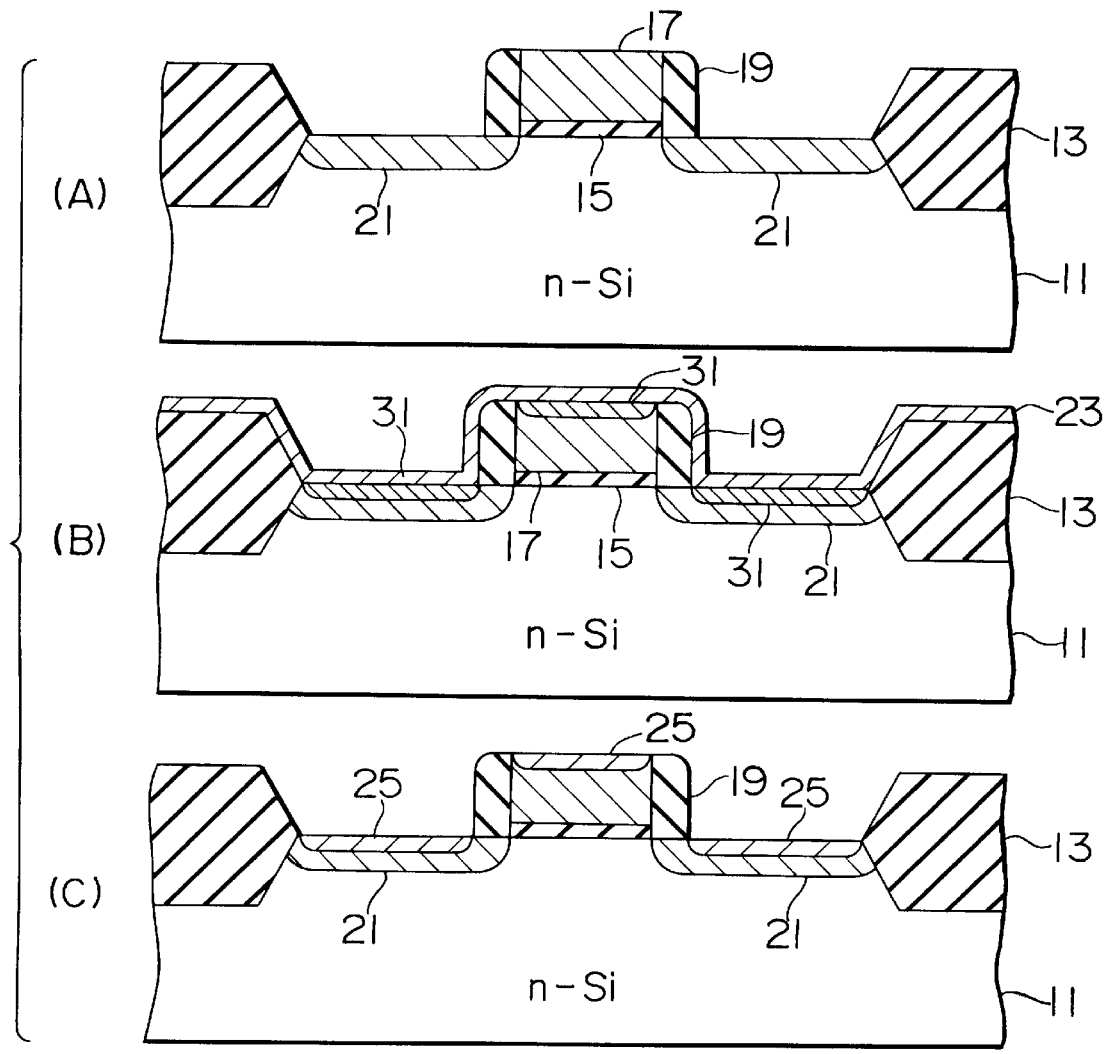
FIGS. 5(A) through (C) are schematic vertical sectional views of an integrated circuit during various steps of manufacture of a method according to a first embodiment of the instant invention.

Referring now to FIGS. 5(A) through (C), an integrated circuit is shown, manufactured by a method according to a first embodiment of this invention. Similar parts are designated by like reference numerals.

In FIGS. 5(A), the diffusion region 21 was formed in accordance with manufacturing steps described with reference to FIG. 1(A). It should be noted that the titanium film 23 (FIG. 1(A)) was later formed.

In FIG. 5(B), an amorphous region 31 was formed in each of the diffusion regions 21 and the gate electrode 17 by ion injection known in the art. It is possible to use either arsenic or phosphor ions for carrying out the ion injection into both the n-type and the p-type diffusion regions.

Below the amorphous regions 31, the diffusion region remains as an underlying crystal region 21. Each amorphous region 31 may have an amorphous region thickness or depth between 600 and 1200 angstroms.

Together with either the crystalline region 21 or a remaining portion of the gate electrode 17, the amorphous region 31 serves as the afore-mentioned silicon part which has an exposed surface of the amorphous region 31 as the exposed part surface. In this manner, the integrated circuit assembly was manufactured by the method which now additionally comprises a step of turning a portion of the silicon part into the amorphous regions 31. Subsequently the titanium film 23 was sputtered onto the exposed assembly surface to provide the integrated circuit composite like that in FIG. 1(A).

In FIG. 5(C), the integrated circuit composite was subjected to the first heat treatment described in conjunction with FIG. 1(B). The higher resistivity titanium silicide film 25 was formed. The integrated circuit composite with the higher resistivity titanium silicide films 25 was subsequently dipped in the aqueous solution of hydrogen peroxide and ammonia and then subjected to the second heat treatment in the manner described in connection with FIG. 1(B). The lower resistivity titanium silicide films 25 were obtained as the metal silicide films.

It has been confirmed that the higher resistivity titanium silicide film 25 and consequently the lower resistivity titanium silicide film 25 is satisfactorily uniformly formed into the gate electrode 17 or into each diffusion region 21 which may be doped with the n-type impurity to the high impurity concentration exemplified before. Formation of the higher or the lower resistivity titanium silicide film 25 is uniform both along and vertically of the silicon part and scarcely results in the nonuniformity illustrated with reference to FIG. 4. Furthermore, the higher resistivity and consequently the lower resistivity titanium silicide films 25 have an approximately common film thickness both on the n-type and the p-type diffusion regions.

Figure 6:
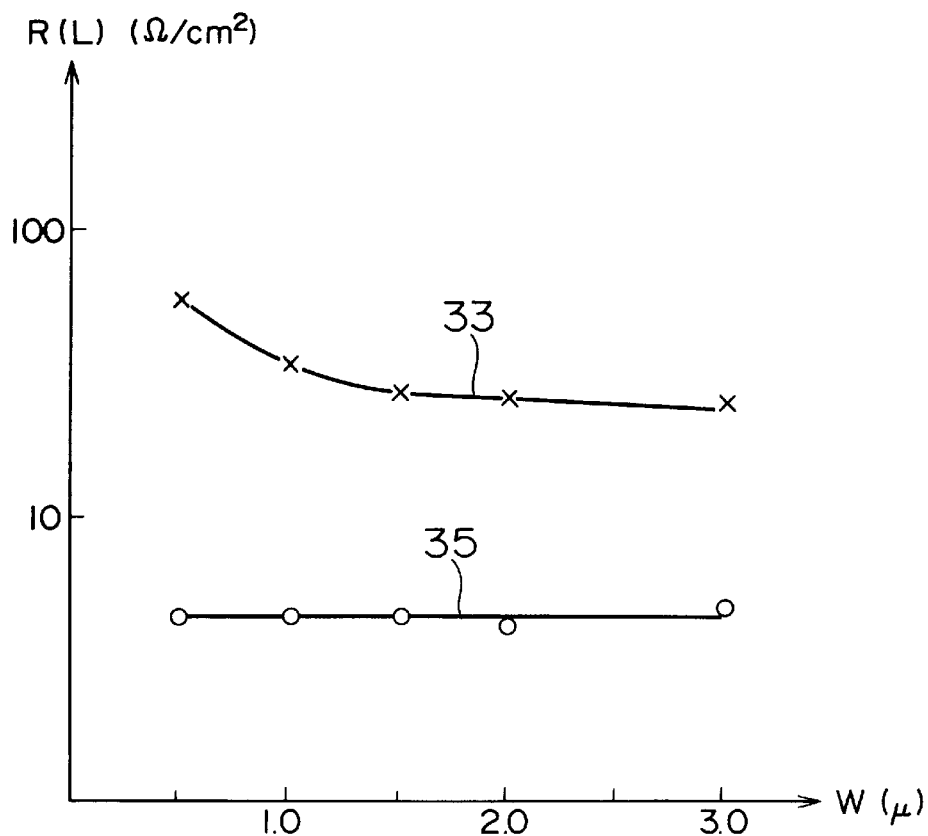
FIG. 6 is a diagram illustrative of characteristics of integrated circuits manufactured in accordance with a conventional method and the method of the present invention in connection with FIGS. 5(A) through (C)

Turning to FIG. 6, the layer resistance value of the titanium silicide film, namely, the lower resistivity titanium silicide film 25 (FIG. 5(C)), is logarithmically scaled as R(L) along the ordinate in ohms per square centimeter. The wiring width is linearly scaled as W along the abscissa in microns.

The layer resistance values were measured in connection with integrated circuits manufactured in accordance with the conventional method and are depicted by a curve 33. Other layer resistance values were measured with respect to integrated circuits manufactured by the method illustrated with reference to FIGS. 5(A) through (C) and are shown by a substantially straight line 35.

Attention will be directed to the curve 33. When the wiring width decreases to 0.5 micron, the layer resistance value increases to about 50 ohms per square centimeter. This shows that the lower resistivity titanium silicide film is either formed not at all or only discontinuously along the exposed part surface because the "layer" resistance value is that of the diffusion region 21 (FIGS. 5(A) through (C)).

Figure 7:
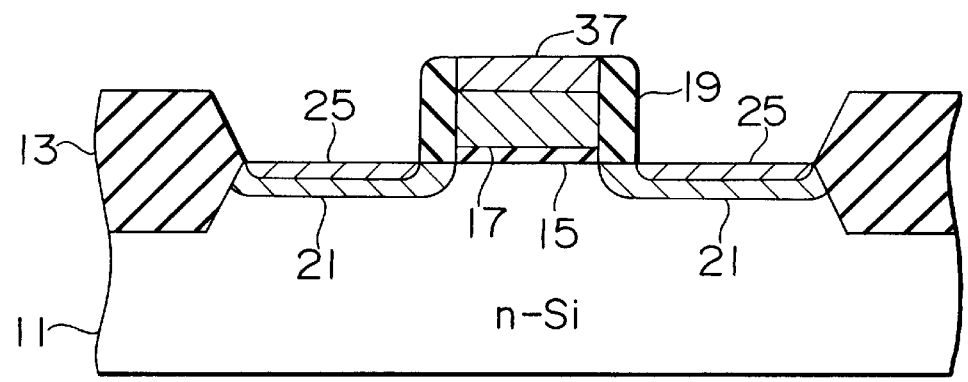
FIG. 7 is a schematic vertical sectional view of another integrated circuit in one of the various steps of manufacture according to the method illustrated in FIGS. 5(A) through (C)

Referring to FIG. 7, another integrated circuit was manufactured by a method which was substantially identical in principle to the method illustrated with reference to FIGS. 5(A) through (C). Similar parts are designated by like reference numerals.

In FIG. 7, a tungsten silicide layer 37 was formed in a conventional manner on the gate electrode 17. After being patterned, a combination of the gate insulation film 15, the gate electrode 17, and the tungsten silicide layer 37 was surrounded by the side wall 19.

The integrated circuit assembly now additionally comprises the tungsten silicide layer 37. The exposed assembly surface includes an exposed surface of the tungsten silicide layer 37. Although silicon is included in the tungsten silicide layer 37, this layer 37 should not be considered as the afore-mentioned silicon part.

In the manner described in conjunction with FIG. 5(B), the titanium film 23 was sputtered onto the exposed assembly surface. The integrated circuit composite was subjected to the first heat treatment. It should be noted that the titanium silicide film 25 was not formed on the exposed surface of the tungsten silicide layer 37.

Again referring to FIGS. 5(A) through (C), the integrated circuit was manufactured by a method according to a second embodiment of this invention. Insofar as FIGS. 5(A) and (B) are concerned, this method is not different from the method illustrated with reference to FIGS. 5(A) through (C). FIGS. 2 and 3 will additionally be referred to.

In FIG. 5(C), the first heat treatment was carried out in two steps as a first primary heat treatment and a first secondary heat treatment. A first primary temperature of 650° C. and a first primary time interval of 30 seconds were used in the first primary heat treatment. After the first primary heat treatment, the titanium film 23 remains together with the titanium nitride film 27 as a spurious film in the manner described in conjunction with FIG. 3 on the exposed portion surface or, more particularly, on the titanium oxide film 29.

During the first secondary heat treatment, a first secondary temperature of 800° C. and a first secondary time interval of 30 seconds were used similarly to those of the second heat treatment described before. By the first secondary heat treatment, the titanium nitride film 27 was grown into contact with the titanium oxide film 29. Following the first secondary heat treatment, the titanium nitride film 27 was removed from the integrated circuit assembly.

After the removal of the titanium nitride film 27, the integrated circuit assembly with the titanium silicide films 25 was subjected to the second heat treatment in the aforementioned nitrogen atmosphere. A second temperature of 800° C. and a second time interval of 10 seconds were selected.

It has been confirmed that the first temperature should be between 600° C. and 700° C. The second primary and secondary temperatures should be between 700° C. and 900° C. This method is applicable to manufacture of the integrated circuit illustrated in FIG. 7.

Turning to FIG. 8, the layer resistance value R(L) of the titanium silicide film is logarithmically scaled along the ordinate in ohms per square centimeter. The wiring width W is linearly scaled along the abscissa in microns. Three kinds of integrated circuits were manufactured.

The integrated circuits of one of the three kinds were manufactured with neither the step of providing an amorphous layer nor the first and the second heat treatments. The layer resistance values were measured. Their averages are indicated by small diamonds. The integrated circuits of a second of the three kinds were manufactured with the amorphous turning step and without the first primary and secondary and the second heat treatments. Averages of the layer resistance values are indicated by small triangles. The integrated circuits of a third or last one of the three kinds were manufactured in accordance with the method illustrated by again referring to FIGS. 5(A) through (C). Averages of the layer resistance values are indicated by small circles. These averages do not substantially deviate from a dashed line 39.

It was described hereinabove in connection with FIGS. 1(A) and (B), 2, and 3 that silicon diffuses through the titanium film 23 from its portion overlying the silicon part 21 or 17 to another portion overlying the silicon dioxide portion 13 or 19. A similar tendency occurs through the titanium film 23 during the first primary heat treatment from its portion overlying a highly p-doped region to another portion overlying the silicon dioxide portion 13 or 19. It has, however, been confirmed that use of the arsenic or the phosphor ions for the step of providing an amorphous layer reduces the difference in rates of diffusion of silicon into the titanium film 23 on the p-doped and the n-doped regions and to prevent silicon from diffusing through the metal film 23 from its portion overlying the highly p-doped region to its portion overlying the silicon dioxide portion 13 or 19.

Once again referring to FIGS. 5(A) through (C), the integrated circuit was manufactured by a method according to a third embodiment of this invention. Although depicted, the amorphous region or regions 31 were not used.

The heat treatment was carried out in the manner described above by again referring to FIGS. 5(A) through (C), 2, and 3. The first primary temperature of 650° C. and the first primary time interval of 30 seconds were used. The first secondary temperature was 800° C. and the first secondary time interval was from 20 to 30 seconds. The second temperature was 800° C. and the second time interval was 30 seconds.

Once more referring to FIG. 3, in addition to FIGS. 5(A) through (C), the titanium nitride film 27 grew during the first secondary heat treatment to come in contact with the titanium oxide film 29. The titanium nitride film 27 (FIGS. 2 and 3) was removed after the first secondary heat treatment and before the second heat treatment. It has been confirmed that the titanium silicide film 25 was satisfactorily formed even on or along the gate electrode 17 which had a gate length of 0.4 micron and was doped with arsenic. This method is applicable to the integrated circuit illustrated in to FIG. 7.

Turning to FIG. 9, the layer resistance value R(L) of the titanium silicide film is logarithmically scaled along the ordinate in ohms per square centimeter. The wiring width W is linearly scaled along the abscissa in microns. Two kinds of integrated circuits were manufactured.

The integrated circuits of one of the two kinds were manufactured with the first primary heat treatment alone. The layer resistance values are indicated by small triangles. The integrated circuits of the other of the two kinds were manufactured by the method illustrated by once again referring to FIGS. 5(A) through (C). Their layer resistance values are indicated by small circles.

It will be appreciated that the integrated circuits of the present invention are appreciably improved when compared with conventional ones although the amorphous turning step is not carried out. Incidentally, it was possible if desired to remove the spurious film, if any, after the first secondary heat treatment and before the second heat treatment of the method thus far illustrated with reference to FIGS. 5(A) through (C).

What is claimed is:

1. A method of manufacturing an integrated circuit, comprising the steps of manufacturing an integrated circuit assembly having an exposed assembly surface and including a semiconductor substrate and a doped silicon part formed of p-type and n-type diffusion regions along said semiconductor substrate to consist essentially of silicon and to have an exposed part surface as a portion of said assembly surface; carrying out ion insertion of ions of a single impurity regions to turn said silicon part into an amorphous part adjacent to said exposed part surface, forming a metal film on said exposed assembly surface to provide an integrated circuit composite, and heat treating said integrated circuit composite to turn said metal film into a metal silicon film on said exposed part surface, wherein said integrated circuit assembly includes a silicon dioxide portion formed on said semiconductor substrate to consist essentially of silicon dioxide and to have an exposed portion surface as a part of said exposed assembly surface, said heat treating step comprising first and second heat treating steps, both carried out in a nitrogen atmosphere consisting essentially of nitrogen, wherein:

said first heat treating step comprises first primary and secondary heat treating steps, said first primary heat treating step heat treating said integrated circuit composite to turn said metal film into a higher resistivity metal silicide film and into a spurious film on said exposed part and portion surfaces, said first secondary heat treating step turning said spurious film into a metal nitride film;

said second heat treating step turning said higher resistivity metal silicide film into a lower resistivity metal silicide film for use as the first-mentioned metal silicide film;

said method further comprising the step of removing said metal-nitride film after said first secondary heat treating step and before said second heat treating step, and wherein the first secondary heat treating step is carried out at a higher temperature than the first primary heat treating step with said lower resistivity metal silicide film given by formation of said amorphous part a uniform thickness on both said p-type and said n-type diffusion regions.

2. A method as claimed in claim 1, wherein:

said first primary heat treating step is carried out at a first primary temperature between 600° C. and 700° C.;

said first secondary heat treating step is carried out at a first secondary temperature between 700° C. and 900° C.;

said second heat treating step being carried out at a second temperature between 700° C. and 900° C.

3. A method of manufacturing an integrated circuit comprising the steps of manufacturing an integrated circuit assembly having an exposed assembly surface and including a semiconductor substrate and a doped silicon part formed of p-type and n-type diffusion regions along said semiconductor substrate to consist essentially of silicon and to have an exposed part surface as a portion of assembly surface; forming a metal film on said exposed assembly surface to provide an integrated circuit composite; and heat treating said integrated circuit composite so as to turn said metal film into a metal silicide film having a uniform thickness on both said p-type and n-type diffusion regions of said exposed part surface, wherein said heat treating step is carried out first at a primary temperature between 600° C. and 700° C. and subsequently at a secondary temperature between 700° C. and 900° C., said heat treating step comprising first and second heat treating steps, both carried out in a nitrogen atmosphere consisting essentially of nitrogen, wherein:

wherein said integrated circuit assembly includes a silicon dioxide portion formed on said semiconductor substrate to consist essentially of silicon dioxide and to have an exposed portion surface as a part of said exposed assembly surface;

said first heat treating step comprises first primary and secondary heat treating steps, said first primary heat treating step using said primary temperature as a first primary temperature, said first secondary heat treating step using said secondary temperature as a first secondary temperature;

said second heat treating step is carried out at a second temperature between 700° C. and 900° C.; and the method further comprising the step of removing a metal nitride film after said first secondary heat treating step and before said second heat treating step.

4. A method as claimed in claim 3, wherein said integrated circuit assembly includes a silicon dioxide portion formed on said semiconductor substrate to consist essentially of silicon dioxide and to have an exposed portion surface as a part of said exposed assembly surface, and wherein:

said first primary heat treating step heat treats said integrated circuit composite to turn said metal film into a higher resistivity metal silicide film and into a spurious film on said exposed part and portion surfaces, said first secondary heat treating step turning said spurious film into said metal nitride film;

said second heat treating step turning said higher resistivity metal silicide film into a lower resistivity metal silicide film for use as the first-mentioned metal silicide film.

5. A method as claimed in claim 1, wherein said ions of single impurity are arsenic or phosphorous ions.

6. A method of manufacturing an integrated circuit, comprising the steps of:

forming a doped silicon part as p-type and n-type diffusion regions along a semiconductor substrate and a polysilicon part as a gate electrode between each set of said p-type diffusion regions and said n-type diffusion regions to provide a silicon part having an exposed part surface as a portion of an exposed assembly surface;

forming a metal film on said exposed assembly surface to provide an integrated circuit composite; and heat treating said integrated circuit composite to turn said metal film into a metal silicide film on said exposed part surface, wherein:

said method further comprises the step of carrying out ion injection of ions of a single impurity simultaneously into said p-type and said n-type diffusion regions and said gate electrode to turn said silicon part into an amorphous silicon part adjacent to said exposed part surface;

said heat treating step comprising first and second heat treating steps, both carried out in a nitrogen atmosphere consisting essentially of nitrogen, said first heat treating step comprising:

a first primary heat treating step of turning said metal film into a higher resistivity metal silicide film on said silicon part and into a spurious film on said higher resistivity metal silicide film; and a first secondary heat treating step, at a higher temperature than said first primary heat treating step, of turning said spurious film into a metal nitride film and of turning in cooperation with said second heat treating step said higher resistivity metal silicide film into a lower resistivity metal silicide film;

said method still further comprising the step of removing said metal nitride film after said first secondary heat treating step and before said second heat treating step.

7. A method as claimed in claim 10, wherein said ions of single impurity are arsenic or phosphorus ions.

8. A method as claimed in claim 7, further comprising the step of forming a silicon dioxide portion between said gate electrode and each of said p-type and said n-type diffusion regions, and forming a silicon dioxide element isolation portions around each set of said p-type diffusion regions and said n-type diffusion regions to form a collective dioxide portion having an exposed portion surface as another part of said exposed assembly surface, said first primary heat treating step turning said metal film into said spurious film on said exposed portion surface.

9. A method as claimed in claim 8, wherein:

said first primary heat treating step is carried out at a first primary temperature between 600° C. and 700° C.;

said first secondary heat treating step being carried out at a first secondary temperature between 700° C. and 900° C.;

said second heat treating step being carried out at a second temperature between 700° C. and 900° C.

10. A method of manufacturing a complementary metal-oxide-semiconductor integrated circuit, comprising the steps of:

forming doped silicon part as p-type source and drain regions and n-type source and drain regions along a semiconductor substrate and a polysilicon part as a gate electrode between each set of said p-type source and drain regions and said n-type source and drain regions to provide a silicon part having an exposed part surface as a portion of exposed assembly surface;

forming a silicon dioxide portion between said gate electrode and each of said p-type and said n-type source and drain regions, and forming a silicon dioxide element isolation portion around each set of said p-type source and drain regions and said n-type source and drain regions to form a collective dioxide portion having an exposed portion surface an another part of said exposed assembly surface;

forming a metal film on said exposed assembly surface to provide an integrated circuit composite; and heat treating said integrated circuit composite to turn said metal film into a metal silicide film on said exposed part surface and into a metal oxide film on said portion surface;

wherein said method further comprises the step of carrying out ion injection of ions of a single impurity simultaneously into said p-type and said n-type source and drain regions and said gate electrode to turn said silicon part into an amorphous silicon part adjacent to said exposed part surface;

said heat treating step comprising first and second heat treating steps, both carried out in a nitrogen atmosphere consisting essentially of nitrogen, said first heat treating step comprising:

a first primary heat treating step of turning said metal film into a higher resistivity metal film on said exposed part surface, into a metal oxide film on said exposed portion surface, and into a spurious film on said metal silicide and oxide films; and a first secondary heat treating step, at a higher temperature than said first heat treating step, of turning said spurious film into a metal nitride film and of turning in cooperation with said second heat treating step said higher resistivity metal silicide film into a lower resistivity metal silicide film.

11. A method as claimed in claim 10, wherein said ions of single impurity are arsenic or phosphorous ions.

12. A method as claimed in claim 11, wherein:

said first primary heat treating step is carried out at a first primary temperature between 600° C. and 700° C.;

said first secondary heat treating step being carried out at a first secondary temperature between 700° C. and 900° C.;

said second heat treating step being carried out at a second temperature between 700° C. and 900° C.

* * * * *